United States Patent
Yeo et al.

(10) Patent No.: US 7,001,817 B2
(45) Date of Patent: Feb. 21, 2006

(54) METHOD FOR FABRICATING A SEMICONDUCTOR DEVICE

(75) Inventors: Sang-Won Yeo, Seoul (KR); Jeong-Sic Jeon, Gyeonggi-do (KR); Chang-Jin Kang, Suwon-shi (KR); Chang-Won Lee, Gwacheon-si (KR)

(73) Assignee: Samsung Electronics Co., Ltd., (KR)

( * ) Notice: Subject to any disclaimer, the term of this patent is extended or adjusted under 35 U.S.C. 154(b) by 80 days.

(21) Appl. No.: 10/696,417

(22) Filed: Oct. 29, 2003

(65) Prior Publication Data

US 2004/0092075 A1    May 13, 2004

(30) Foreign Application Priority Data

Nov. 11, 2002 (KR) .................. 10-2002-0069539

(51) Int. Cl.
*H01L 21/336* (2006.01)
(52) U.S. Cl. .................. 438/299; 438/230; 438/303; 438/305
(58) Field of Classification Search ............... 438/229, 438/230, 231, 232, 301, 302, 303, 305; 257/327, 257/325, 336, 408
See application file for complete search history.

(56) References Cited

U.S. PATENT DOCUMENTS

| 5,786,254 A | * | 7/1998 | Hao et al. .................... 438/287 |
| 5,990,532 A | * | 11/1999 | Gardner ...................... 257/410 |
| 6,596,599 B1 | * | 7/2003 | Guo ............................ 438/305 |
| 6,716,689 B1 | * | 4/2004 | Bae et al. .................... 438/182 |
| 6,803,624 B1 | * | 10/2004 | Rudeck et al. ............... 257/315 |

FOREIGN PATENT DOCUMENTS

| KR | 20020013195 | 2/2002 |
| LR | 19990062007 | 7/1999 |

* cited by examiner

*Primary Examiner*—Kevin M. Picardat
(74) *Attorney, Agent, or Firm*—F. Chau & Associates LLC

(57) ABSTRACT

A method for fabricating a semiconductor device, including forming a gate insulating film and a gate electrode film on a semiconductor substrate, and patterning the gate electrode film to form a gate electrode. A portion of the gate insulating film is removed to form an undercut region beneath the gate electrode. A buffer silicon film is formed over an entire surface of the resultant substrate to cover the gate electrode and to fill the undercut region. The buffer silicon film is selectively oxidized to form a buffer silicon oxide film.

20 Claims, 5 Drawing Sheets

METHOD FOR FABRICATING A SEMICONDUCTOR DEVICE

BACKGROUND OF THE INVENTION

1. Field of the Invention

The present invention relates to a method for fabricating a semiconductor device, and more particularly, to a method for fabricating a gate electrode in a semiconductor device.

2. Description of the Related Art

In a conventional fabrication process of a semiconductor device, a gate electrode of an MOS (Metal Oxide Semiconductor) transistor is fabricated through the following steps.

A gate electrode material is formed to a predetermined thickness on the underlying semiconductor substrate having a gate oxide film interposed therebetween.

Next, the gate electrode material is partially etched to form the gate electrode in a predetermined shape, i.e., a linear shape.

After that, the resultant substrate is subjected to a selective oxidation process, thereby repairing damage caused by the etching process, assuring reliability of the gate oxide film, preventing an electric field from being concentrated on an edge portion beneath the gate electrode, and preventing GIDL (Gate Induced Drain Leakage) due to the gate electrode.

Generally, the gate electrode material is formed of polysilicon having excellent interfacing properties in a high temperature environment with respect to the gate oxide film. However, as semiconductor devices become more highly integrated, the conventional polysilicon gate electrode does not satisfy the requirements for sheet resistance of the gate electrode and operation speed.

Recently, a proposed method for forming a metallic gate electrode in which a refractory metal, for example, tungsten, is stacked on the polysilicon gate electrode. However, since a tungsten film has an undesired active reaction with the underlying polysilicon gate electrode, a conductive barrier film is formed between the tungsten film and the polysilicon gate electrode.

In the method of forming a metallic gate electrode comprised of atungsten film, a conductive film and a polysilicon gate electrode, undesirable oxidation occurs along an edge portion beneath the metallic gate electrode during the selective oxidation process and also oxygen penetrates into an interface between the conductive barrier film and the overlying tungsten film, thereby creating an undesired oxygen-series of amorphous foreign particles.

Also, when a self-aligned contact technology is employed in a cell region, a capping nitride film is formed on the tungsten film. In this case, oxygen penetrates into the interface between the capping nitride film and the underlying tungsten film during the selective oxidation process, thereby creating undesired foreign particles at the interface therebetween.

Accordingly, a disadvantage exists in the above described methods in that undesired alien substances cause an increase in the resistance of the gate electrode.

Further, since oxygen is intruded into and oxidation occurs along the edge portion beneath the linear-shaped metallic gate electrode in the selective oxidation process, a relatively thick oxide film is formed in the edge portion beneath the gate electrode, thereby causing an increase in the threshold voltage of the transistor.

Moreover, as a minimal line width of the gate electrode becomes gradually smaller, oxidation occurs over the lengths of the gate electrode during the selective oxidation process, thereby deteriorating operational properties of the semiconductor device.

SUMMARY OF THE INVENTION

The various exemplary embodiments of the present invention are directed to a method for fabricating a semiconductor device that substantially obviates one or more problems due to limitations and disadvantages of the conventional art.

A method is provided for fabricating a semiconductor device in which a reliable selective oxidation process can be performed.

A method for fabricating a semiconductor device according to the present invention is characterized in that an oxidation stop layer (or oxygen diffusion-preventive layer) is formed prior to a selective oxidation process or during the selective oxidation process.

A method of fabricating a semiconductor device according to another embodiment of the invention includes removing a portion of a gate insulating film to form an undercut region beneath a gate electrode, that is, at an edge portion beneath the gate electrode. A buffer silicon film is formed as an oxidation stop layer on the resultant substrate to cover the gate electrode and the undercut region. After the buffer silicon film is formed, a selective oxidation process is performed to cure a defect generated at the time of the etching process for forming the gate electrode.

In a fabricating method according to another embodiment of the invention, the buffer silicon film prevents the oxygen from penetrating into the gate electrode in the selective oxidation process. This is because the buffer silicon film itself is combined with the oxygen to be oxidized in the selective oxidation process.

Further, the undercut region forms a physical penetration distance toward a portion beneath the gate electrode that is increased as long as the undercut region, so that oxidation can be more effectively prevented beneath the gate electrode (e.g., at the center of the channel region).

In the fabricating method according to another embodiment of the invention, it is desirable that the portion of the gate insulating film is removed using a wet etching process. The etching solution can be an etching solution generally used in the etching process of the oxidation film.

The gate electrode is formed by depositing a polysilicon film, a refractory metallic film and a capping nitride film on the gate insulating film and patterning the deposited films. The refractory metal film is formed so as to decrease the resistance of the gate electrode, which in turn improves an operation speed of the device. For example, the refractory metal film includes tungsten, titanium, tantalum, molybdenum, cobalt, magnesium, nickel and copper.

It is desirable that a barrier metallic film is further formed between the polysilicon film and the tungsten film. The barrier metallic film prevents a reaction between the polysilicon film and the tungsten film. For example, the barrier metallic film can be formed of a tungsten nitride film, a titanium nitride film, etc.

Further, in the selective oxidation process, a tungsten silicide film can be further formed between a surface of the tungsten film exposed in a gate sidewall portion and the buffer silicon film contacting therewith. In this case, a resistance characteristic of the gate electrode is further improved.

Prior to the selective oxidation process, the etch-back process may be further performed for the buffer silicon film. Accordingly, a buffer silicon spacer is formed on both sidewalls of the gate electrode. In this case, the buffer silicon spacer is oxidized through the selective oxidation process and thus oxygen is prevented from penetrating through the sidewall of the gate electrode.

A method of fabricating a semiconductor device according to another embodiment of the invention further includes performing a lightly-doped implantation to form a lightly-doped impurity region. This is to form a lightly-doped drain region. The conductive type of the implanted impurity ion is opposite to that of the semiconductor substrate. For example, if the semiconductor substrate is P-type conductive, the implanted impurity ion is N-type conductive. The gate electrode and the oxidized buffer silicon film formed on the sidewall thereof are used as an implant mask. Accordingly, the lightly-doped impurity region is positioned at both sides of the gate electrode, and in more detail, in the semiconductor substrate at sides of the oxidized buffer silicon film formed on both sidewalls of the gate electrode.

A fabricating method of the semiconductor device according to another embodiment of the invention further includes forming and etching-back a spacer nitride film to form a nitride spacer on both sidewalls of the gate electrode, and performing a heavily-doped implanting process to form a heavily-doped impurity region. Resultantly, the oxidized buffer silicon film and the nitride spacer are positioned on the sidewalls of the gate electrode to form a dual spacer.

At the time of the etch-back process for the nitride spacer, since the oxidized buffer silicon film is formed on the semiconductor substrate, a process margin can be increased. The heavily-doped implantation process uses the same impurity type as that of the lightly-doped implanting process, with a relatively higher concentration. The heavily-doped impurity region is formed in the semiconductor substrate, next to the lightly-doped impurity region. As a result, the lightly-doped impurity region is defined in the semiconductor substrate and beneath the nitride spacer. According to exemplary embodiments of the invention, the buffer silicon film used as an oxidation stop layer in the selective oxidation process simultaneously forms the dual spacer. That is, the oxidation stop layer formed for the selective oxidation process is used as an insulating film required when the dual spacer is formed. Accordingly, it is not required to form an additional film for forming the dual spacer. As a result, a simplified and economic fabricating process can be performed.

Further, the lightly-doped impurity region is spaced apart by a thickness of the oxidized buffer silicon from the sidewall of the gate electrode. Thus, the lightly-doped impurity regions are positioned spaced apart from each other with a distance as long as a sum of a length of the gate electrode and two times the thickness of the buffer silicon film. In other words, a length of a channel region is formed larger than a length of the gate electrode. Accordingly, disadvantages due to a short channel effect can be minimized.

It is to be understood that both the foregoing general description and the following detailed description of the present invention are exemplary and explanatory and are intended to provide further explanation of the invention as claimed.

BRIEF DESCRIPTION OF THE DRAWINGS

The above and other aspects of the present invention will become more apparent by describing in detail preferred embodiments thereof with reference to the attached drawings in which.

DETAILED DESCRIPTION OF PREFERRED EMBODIMENTS

Figure 1:
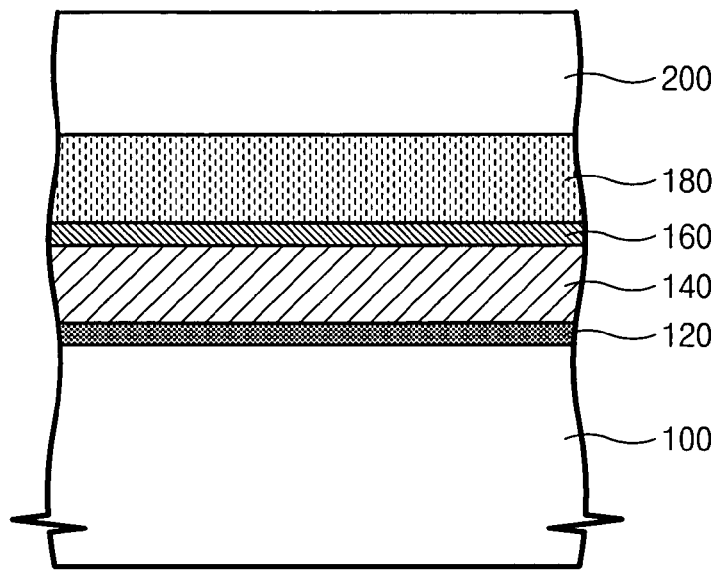
FIGS. 1 to 7 are cross-sectional views illustrating a method for fabricating a gate electrode in a semiconductor device according to an embodiment of the present invention.

Reference will now be made in detail to the preferred embodiments of the present invention, examples of which are illustrated in the accompanying drawings. However, the present invention is not limited to the embodiments illustrated hereinafter, and the embodiments herein are rather introduced to provide easy and complete understanding of the scope and spirit of the present invention.

The various exemplary embodiments of the method of fabricating a semiconductor device according to the invention minimizes oxidation of a conductive film in the fabricated semiconductor device. Though a gate electrode and a word line is described in the preferred embodiments, it will be obvious to those skilled in the art that the inventive method can be effectively applied to stopping oxidation of other conductive structures that are easily oxidized.

FIGS. 1 to 7 are cross-sectional views illustrating a fabricating method of a semiconductor device according to a first embodiment of the present invention. For drawing simplification and description convenience, only one gate electrode is illustrated in the drawings. In the drawings, thickness of layers and regions are exaggerated for clarity. Further, in case it is referred that an arbitrary layer (or film) is formed "on" or "over" another layer or substrate, it implies that the arbitrary layer can be formed in contact with another layer or substrate or a third layer can be interposed therebetween. Identical reference numerals represent identical structural elements.

Referring to FIG. 1, after an active region is defined by a device isolation process, a gate insulating film 120, a polysilicon film 140, a barrier metal film 160, a refractory metal film 180 and a capping nitride film 200 are sequentially formed on a semiconductor substrate 100. The gate insulating film 120 is formed of silicon oxide for insulation between a gate electrode and the underlying semiconductor substrate 100 through a thermal oxidation process. The polysilicon film 140 has an excellent interfacial property in a high temperature atmosphere with respect to the gate insulating film 120. The refractory metal film 180 is formed to decrease the resistance of the gate electrode. For example, the refractory metal film 180 is formed of at least one material selected from a group consisting of tungsten, titanium, tantalum, molybdenum, cobalt, magnesium, nickel and copper. Preferably, the refractory metal film 180 is formed of tungsten.

The barrier metal film 160 is optionally formed so as to prevent a reaction between the polysilicon film 140 and the overlying tungsten film 180. For example, the barrier metal film 160 can be formed of tungsten nitride, titanium nitride or the like.

Figure 2:
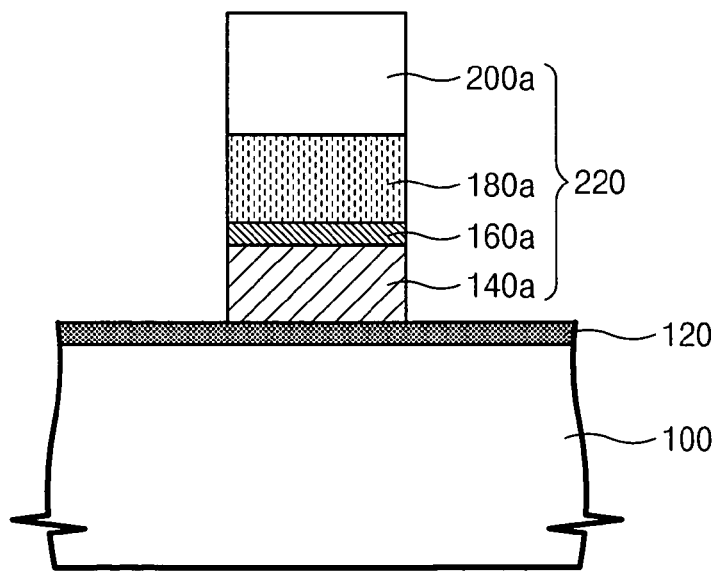

Referring to FIG. 2, the capping nitride film 200, the tungsten film 180, the barrier metal film 160 and the polysilicon film 140 are sequentially patterned to form the gate electrode 220, an upper portion of which is protected by the patterned capping nitride film 200a. As a result, the gate electrode 220 includes the polysilicon film 140a, the barrier metal film 160a and the tungsten film 180a. The patterning process is performed through the steps of forming a photosensitive photoresist film on the capping nitride film 200, patterning the photoresist film through a light-exposure process and a developing process to form a photoresist pattern, and etching the underlying exposed films using the photoresist pattern as an etching mask. At this time, etching of the underlying films 140, 160, 180 and 200 is performed until the gate insulating film 120 is exposed.

Figure 3:
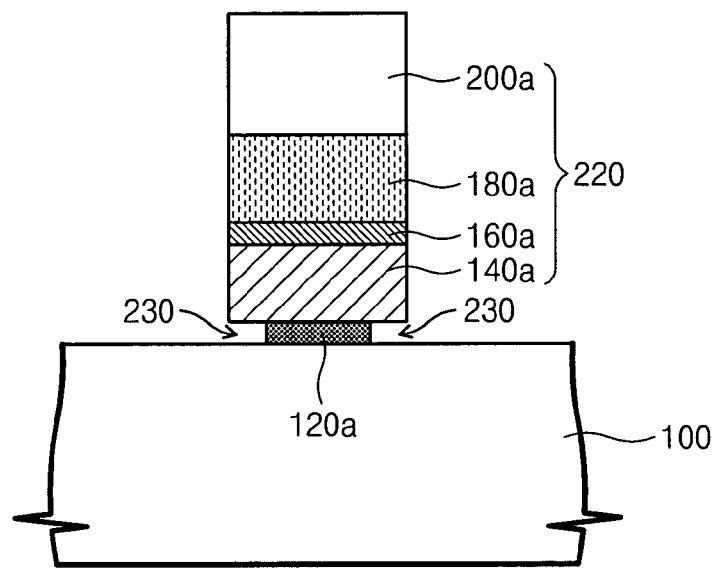

Referring to FIG. 3, the exposed gate insulating film 120 is partly removed from the resultant substrate, so that an undercut region 230 is formed at an edge portion beneath the gate electrode 220. The gate insulating film 120 on the semiconductor substrate 100 and the gate insulating film 120 beneath the gate electrode 220 are concurrently wet-etched and removed from the resultant substrate, thereby forming a remnant gate insulating film 120a beneath the gate electrode 220. As a result, predetermined portions of the resultant substrate facing the bottom edges of the gate electrode 220 are exposed and at the same time both bottom edges of the gate electrode 220 are also exposed.

Figure 4:
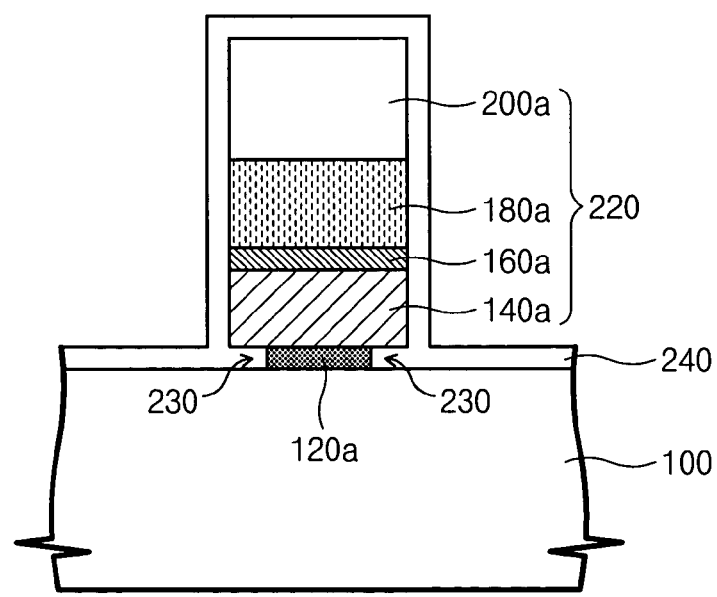

Referring to FIG. 4, a buffer silicon film 240 is formed on an entire surface of the resultant substrate so as to cover the gate electrode 220 including the exposed undercut region 230. In other words, the buffer silicon film 240 is formed on the gate electrode 220 and the exposed semiconductor substrate 100 with a regular thickness while filling the exposed undercut region 230. Accordingly, the sidewalls of the gate electrode 220 are protected. The buffer silicon film 240 can be formed below a thickness of about 200 Å.

Figure 5:
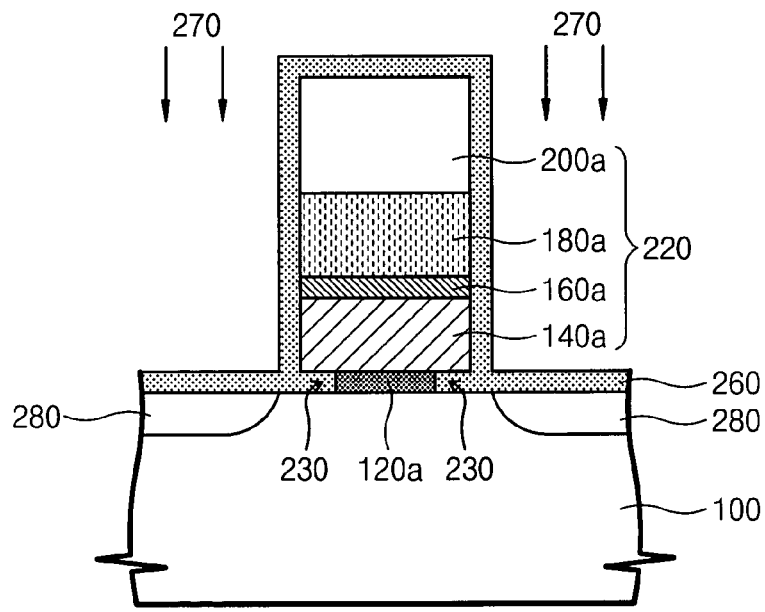

Referring to FIG. 5, a selective oxidation process is performed to recover damage due to the etching process of the gate electrode 220 and to improve the operation property of the semiconductor device. Since the buffer silicon film 240 is formed on the sidewalls of the gate electrode 220 and in the undercut region 230, oxygen is prevented from penetrating into the gate electrode 220 during the selective oxidation process. That is, in the selective oxidation process, the buffer silicon film 240 reacts with oxygen (that is, oxygen consumption) and is oxidized and transformed into a buffer silicon oxide film, i.e., a silicon oxide film 260, thereby functioning as an oxidation stop layer.

During the selective oxidation process, the tungsten film 180a exposed on the sidewalls of the gate electrode 220 reacts with the buffer silicon film 240 in contact with the tungsten film 180a to further form a tungsten silicide film. The tungsten silicide film causes the resistance of the gate electrode to be decreased.

Further, the buffer silicon oxide film 260 is also used as an insulating film for a dual spacer forming process.

Referring again to FIG. 5, after the selective oxidation process, a lightly doped implantation 270 is performed to form a lightly-doped impurity region (that is, Lightly Doped Drain: LDD) region 280 in the semiconductor substrate 100 at both sides of the gate electrode 220. At this time, an impurity ion is implanted that is a conductive type opposite to that of the semiconductor substrate 100. For example, in case the semiconductor substrate 100 is a P-type, the implanted impurity ion is an N-type. In case the semiconductor substrate 100 is an N-type, the impurity ion implanted is a P-type. The lightly-doped impurity region 280 is positioned spaced as much as the thickness of buffer silicon oxide film 260 from both sides of the gate electrode 220. This positional configuration of the lightly-doped impurity region 280 is due to the impurity ion passing through the buffer silicon oxide film 260 formed on the underlying semiconductor substrate 100 and implanting into the semiconductor substrate 100, and the gate electrode 220 and the buffer silicon oxide film 260 formed on the sidewalls thereof functioning as the implant masks.

A problem due to a short channel effect can be eliminated because the lightly-doped impurity region 280 is positioned so as to be spaced by a predetermined distance from both sides of the gate electrode 220.

Figure 6:
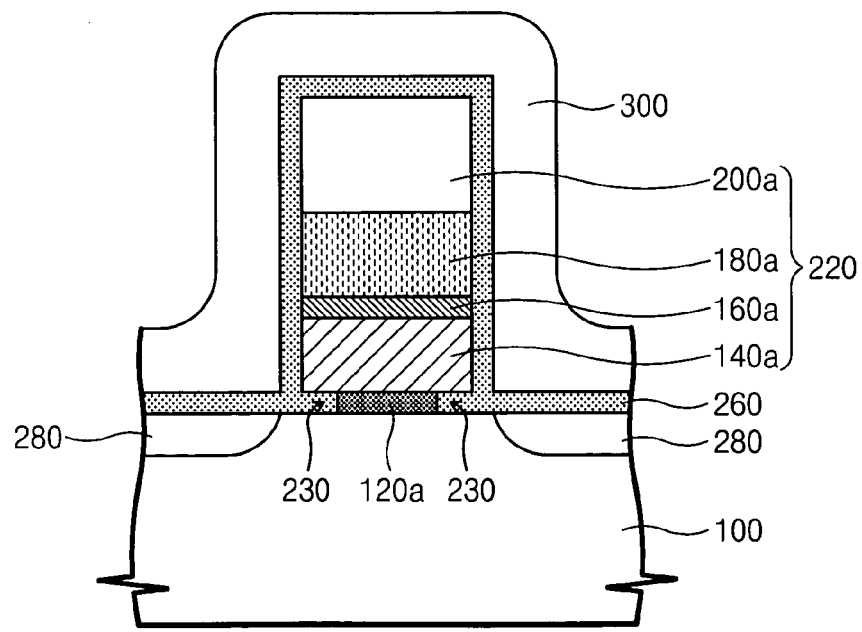

Referring to FIG. 6, a spacer nitride film 300 is formed on the buffer silicon oxide film 260. The spacer nitride film 300 is formed of silicon nitride by Chemical Vapor Deposition (CVD).

Figure 7:
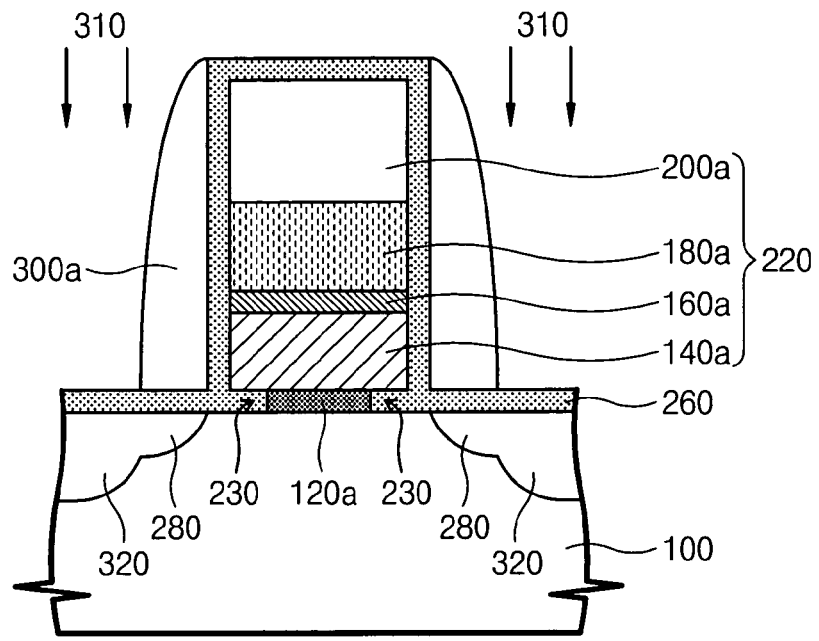

Referring to FIG. 7, the spacer nitride film 300 is etched-back to form a nitride spacer 300a remaining only at both sides of the gate electrode 220. For example, the nitride spacer 300a is formed on the buffer silicon oxide film 260 formed on the sidewalls of the gate electrode 220. Thus, the gate electrode 220 having a dual spacer comprised of the nitride spacer 300a and the buffer silicon oxide film 260 is formed. The buffer silicon oxide film 260 formed on the semiconductor substrate 100 at both sides of the gate electrode 220 increases a process margin for the etch-back process.

A heavily-doped implanting process 310 for the formation of a source/drain region is performed to form a heavily-doped impurity region 320. At this time, the gate electrode 220, the buffer silicon oxide film 260 formed on the sidewalls of the gate electrode 220, and the nitride spacer 300a are used as the implant masks in the heavily-doped implanting process 310. As a result, the heavily-doped impurity region 320 is formed in the semiconductor substrate 100 at both sides of outer sidewalls of the nitride spacer 300a, so that the lightly-doped impurity region 280 is defined in the semiconductor substrate 100 beneath the nitride spacer 300a. The heavily-doped impurity region 320 is formed in succession to the lightly-doped impurity region 280 so as to have a deeper distribution and a higher concentration of impurity than the lightly-doped impurity region 280.

As a result, the source/drain region 320 (e.g., heavily-doped impurity region) is completed including the LDD region 280 (e.g., lightly-doped impurity region).

As described above, in the fabrication methods of the semiconductor device according to exemplary embodiments of the present invention, since the buffer silicon film 240 is oxidized to function as the oxidation stop layer during the selective oxidation process, undesired oxidation of the gate electrode does not occur. Additionally, since the undercut region 230 is formed beneath the gate electrode 220, the oxidation stop effect can be maximized.

Further, since the film serving as the oxidation stop layer during the selective oxidation process is also used as the dual spacer, simplification and economical efficiency of the process can be improved.

Figure 8:
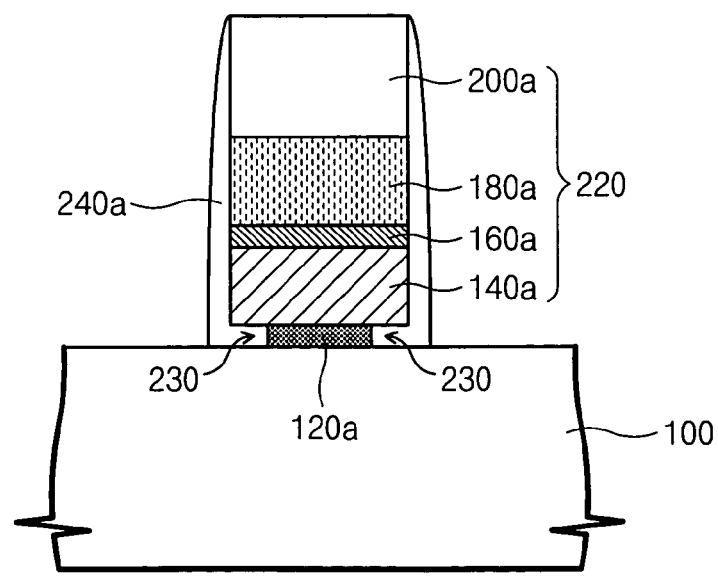
FIGS. 8 to 10 are cross-sectional views illustrating a method for fabricating a gate electrode in a semiconductor device according to another embodiment of the present invention.
Figure 9:
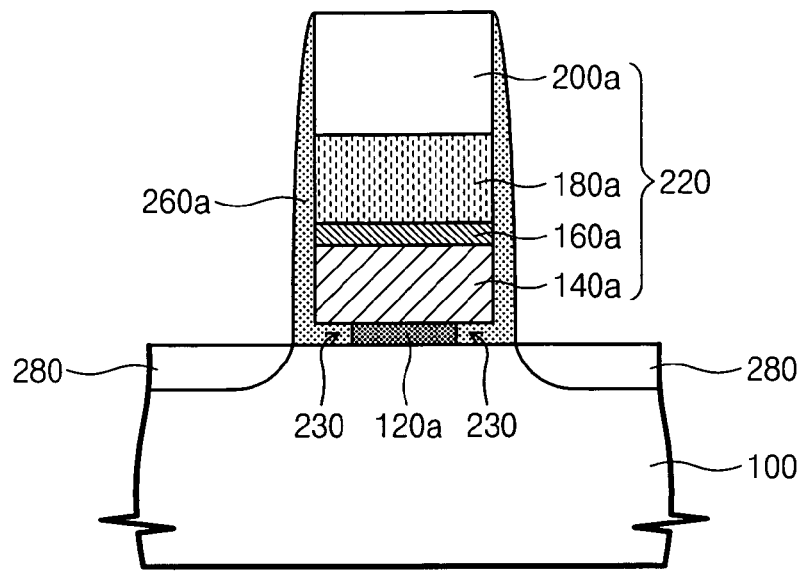
Figure 10:
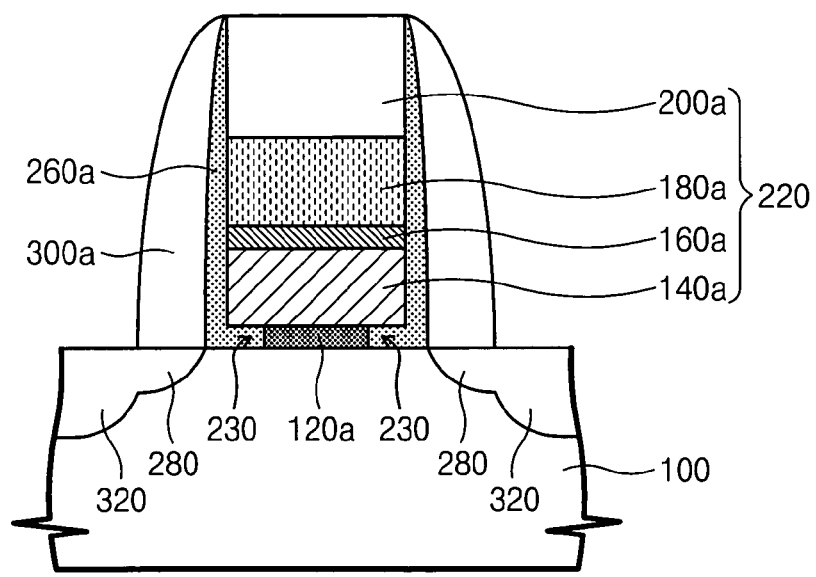

FIGS. 8 to 10 show an alternative embodiment. The process of this embodiment is similar to the process described with reference to FIGS. 1 to 4. After the gate electrode 220 is formed on the semiconductor substrate 100, the undercut region 230 and the buffer silicon film 240 are formed. (See FIG. 4).

Next, referring to FIG. 8, the buffer silicon film 240 is etched-back so that a buffer silicon spacer 240a covering both sidewalls of the gate electrode 220 and filling the undercut region 230 is formed.

Referring to FIG. 9, a selective oxidation process is performed to recover damage due to the etching process of the gate electrode 220 and to improve operation properties of the semiconductor device. At this time, since the buffer silicon spacer 240a is formed on the undercut region 230, oxygen is prevented from penetrating into the gate electrode 220 during the selective oxidation process. During the selective oxidation process, the buffer silicon spacer 240a reacts with oxygen (that is, oxygen consumption) and is oxidized and transformed into a silicon oxide spacer 260a, thereby functioning as the oxidation stop layer. After that, using the same process as in the embodiment described for FIGS. 1 to 4, the lightly-doped impurity region 280 is formed.

Next, referring to FIG. 10, using the same process as in the embodiment described for FIGS. 1 to 4, the nitride spacer 300a and the highly-doped impurity region 320 are sequentially formed.

As described above, in the fabrication methods of the semiconductor device according to exemplary embodiments of the present invention, since the buffer silicon film is oxidized to function as the oxidation stop layer during the selective oxidation process, undesired oxidation of the gate electrode does not occur.

Further, since the undercut region is formed beneath the gate electrode, the oxidation stop effect can be maximized.

Furthermore, since the film functioning as the oxidation stop layer during the selective oxidation process is also used as the dual spacer, simplification and economical efficiency of the process is improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a semiconductor device, the method comprising the steps of:
   forming a gate insulating film and a gate electrode film on a semiconductor substrate;
   patterning the gate electrode film to form a gate electrode;
   removing a portion of the gate insulating film to form an undercut region beneath the gate electrode;
   forming a buffer silicon film on an entire surface of the resultant substrate, the buffer silicon film covering the gate electrode and filling the undercut region; and
   selectively oxidizing the buffer silicon film to form a buffer silicon oxide film.

2. The method of claim 1, wherein the portion of the gate insulating film is removed using a wet etch process.

3. The method of claim 1, wherein the buffer silicon film is oxidized to function as an oxidation stop layer for preventing the gate electrode from being oxidized.

4. The method of claim 1, wherein the gate electrode film forming step comprises the steps of:
   forming a silicon film on the gate insulating film;
   forming a refractory metal film on the silicon film; and
   forming a capping nitride film on the refractory metal film.

5. The method of claim 4, wherein the refractory metal film is formed of at least one selected from a group consisting of tungsten, titanium, tantalum, molybdenum, cobalt, magnesium, nickel and copper.

6. The method of claim 4, further comprising the step of forming a barrier metal film on the silicon film prior to forming the refractory metal film.

7. The method of claim 1, further comprising the steps of:
   performing a lightly-doped implantation to form a lightly-doped impurity region in the semiconductor substrate at both sides of the buffer silicon oxide film formed on sidewalls of the gate electrode;
   forming a spacer nitride film on the buffer silicon oxide film;
   etching-back the spacer nitride film to form a nitride spacer only on the sidewalls of the buffer silicon oxide film formed on the sidewalls of the gate electrode; and
   performing a heavily-doped implantation into the resultant substrate to form a heavily-doped impurity region next to the lightly-doped impurity region, in the semiconductor substrate outside the nitride spacer.

8. The method of claim 7, further comprising the step of etching-back the buffer silicon film so as to allow the buffer silicon film to remain only on the sidewalls of the gate electrode and in the undercut region.

9. A method for fabricating a semiconductor device, comprising the steps of:
   forming a gate insulating film and a gate electrode on a semiconductor substrate;
   etching and removing the gate insulating film exposed at both sides of the gate electrode and at an edge portion of the gate insulating film beneath the gate electrode, to thereby form an undercut region beneath the gate electrode;
   forming a buffer silicon film on an entire surface of the resultant substrate; and
   selectively oxidizing the buffer silicon film to form a buffer silicon oxide film.

10. The method of claim 9, further comprising the steps of:
   performing a lightly doped implantation into the buffer silicon oxide film to form a lightly-doped impurity region in the semiconductor substrate at both sides of the buffer silicon oxide film formed on sidewalls of the gate electrode;
   forming a spacer nitride film on the buffer silicon oxide film;
   etching-back the spacer nitride film to form a nitride spacer only on the sidewalls of the buffer silicon oxide film formed on the sidewalls of the gate electrode; and
   performing a heavily-doped implantation into the resultant substrate to form a heavily-doped impurity region next to the lightly-doped impurity region, in the semiconductor substrate outside the nitride spacer.

11. The method of claim 9, wherein the gate electrode forming step comprises the steps of:
   forming a silicon film, a tungsten film and a capping nitride film on the gate insulating film; and
   patterning the capping nitride film, the tungsten film and the silicon film.

12. The method of claim 11, further comprising the step of forming a barrier metal film between the silicon film and the tungsten film.

13. The method of claim 9, wherein the buffer silicon film is oxidized to act as an oxidation stop layer, thereby preventing the gate electrode from being oxidized.

14. The method of claim 9, wherein the portion of the gate insulating film is removed using a wet etch process.

15. A method for fabricating a semiconductor device, comprising the steps of:
   forming a gate insulating film, a silicon film, a barrier metal film, a tungsten film and a capping nitride film on a semiconductor substrate;
   patterning the capping nitride film, the tungsten film, the barrier metal film and the silicon film to form a gate electrode;
   wet-etching and removing the gate insulating film exposed at both sides of the gate electrode, and at an edge portion of the gate insulating film beneath the gate electrode, to form an undercut region beneath the gate electrode;

forming a buffer silicon film on an entire surface of the resultant substrate in which the undercut region is formed;

selectively oxidizing the buffer silicon film to form a buffer silicon oxide film;

performing a lightly-doped implantation into the buffer silicon oxide film to form a lightly-doped impurity region in the semiconductor substrate at both sides of the buffer silicon oxide film formed on sidewalls of the gate electrode;

forming a spacer nitride film on the buffer silicon oxide film;

etching-back the spacer nitride film to form a nitride spacer; and performing a heavily-doped implanting into the resultant substrate to form a heavily-doped impurity region next to the lightly-doped impurity region, in the semiconductor substrate outside the nitride spacer.

16. The method of claim 15, further comprising the step of etching-back the buffer silicon film so as to allow the buffer silicon film to remain only on the sidewalls of the gate electrode and in the undercut region.

17. The method of claim 15, wherein the buffer silicon film is oxidized to act as an oxidation stop layer, thereby preventing the gate electrode from being oxidized.

18. A semiconductor device, comprising:
a semiconductor substrate;
a gate electrode formed over the substrate, the gate electrode including a gate insulating film, a portion of the gate insulating film being removed to form an undercut region beneath the gate electrode; and
a buffer silicon oxide film formed over sidewalls of the gate electrode and within the undercut region.

19. The semiconductor device of claim 18, further comprising:
lightly-doped impurity regions formed in the semiconductor substrate at sides of the buffer silicon oxide film.

20. The semiconductor device of claim 18, further comprising;
nitride spacers formed on sidewalls of the buffer silicon oxide film; and
heavily doped impurity regions formed next to the lightly-doped impurity regions in the semiconductor substrate at sides of the nitride spacers.

* * * * *